(12) United States Patent
Crippa et al.

(10) Patent No.: US 10,782,319 B2
(45) Date of Patent: Sep. 22, 2020

(54) PROBE CARD FOR ELECTRONICS DEVICES

(71) Applicant: TECHNOPROBE S.P.A., Cernusco Lombardone (IT)

(72) Inventors: Roberto Crippa, Cernusco Lombardone (IT); Stefano Felici, Cernusco Lombardone (IT)

(73) Assignee: TECHNOPROBE S.P.A., Cernusco Lombardone (IT)

( * ) Notice: Subject to any disclaimer, the term of this patent is extended or adjusted under 35 U.S.C. 154(b) by 79 days.

(21) Appl. No.: 16/219,783

(22) Filed: Dec. 13, 2018

(65) Prior Publication Data

US 2019/0113539 A1   Apr. 18, 2019

Related U.S. Application Data

(63) Continuation-in-part of application No. PCT/EP2017/068832, filed on Jul. 26, 2017.

(30) Foreign Application Priority Data

Jul. 28, 2016  (IT) .................. 102016000079679

(51) Int. Cl.
*G01R 1/073* (2006.01)
*G01R 3/00* (2006.01)
*G01R 31/28* (2006.01)

(52) U.S. Cl.
CPC ..... *G01R 1/07378* (2013.01); *G01R 1/07357* (2013.01); *G01R 3/00* (2013.01); *G01R 31/2887* (2013.01)

(58) Field of Classification Search
None
See application file for complete search history.

(56) References Cited

U.S. PATENT DOCUMENTS

| 5,376,889 A | 12/1994 | Milroy et al. |
| 6,853,208 B2 | 2/2005 | Okubo et al. |
| 6,927,586 B2 | 8/2005 | Thiessen |
| 7,417,447 B2 | 8/2008 | Kister |

(Continued)

FOREIGN PATENT DOCUMENTS

| JP | 2008-70266 A | 3/2008 |
| JP | 2015-25749 A | 2/2015 |

*Primary Examiner* — Paresh Patel
(74) *Attorney, Agent, or Firm* — Seed Intellectual Property Law Group LLP

(57) ABSTRACT

A probe card for testing of electronic devices comprises a testing head with plural contact probes inserted into guide holes of an upper guide and a lower guide, and a space transformer, each of the contact probes having a first terminal portion projecting from the lower guide with a first length and ending with a contact tip adapted to abut onto a respective contact pad of a device to be tested, and a second terminal portion projecting from the upper guide with a second length and ending with a contact head adapted to abut onto a contact pad of the space transformer. The probe card comprises a spacer element interposed between the space transformer and the upper guide and removable to adjust the first length of the first terminal portion by changing the second length of the second terminal portion and approaching the upper guide and the space transformer.

6 Claims, 9 Drawing Sheets

(56) References Cited

U.S. PATENT DOCUMENTS

| | | | |
|---|---|---|---|
| 2003/0099097 A1* | 5/2003 | Mok | H05K 7/1061 361/767 |
| 2004/0135594 A1 | 7/2004 | Beaman et al. | |
| 2006/0066328 A1 | 3/2006 | Clegg et al. | |
| 2008/0150564 A1 | 6/2008 | Schmid et al. | |
| 2009/0002009 A1 | 1/2009 | Brandorff | |
| 2012/0319711 A1 | 12/2012 | Hung et al. | |
| 2015/0309076 A1 | 10/2015 | Felici et al. | |

\* cited by examiner

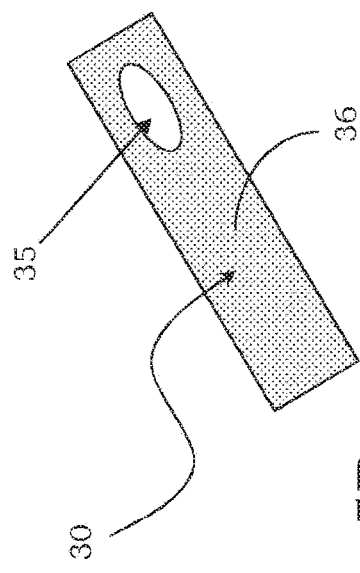
FIG. 5A
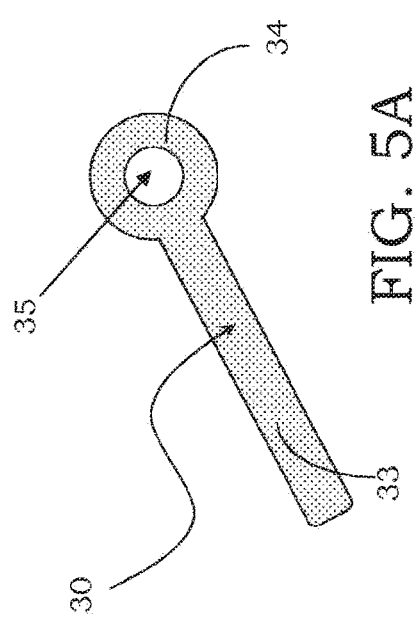
FIG. 5B
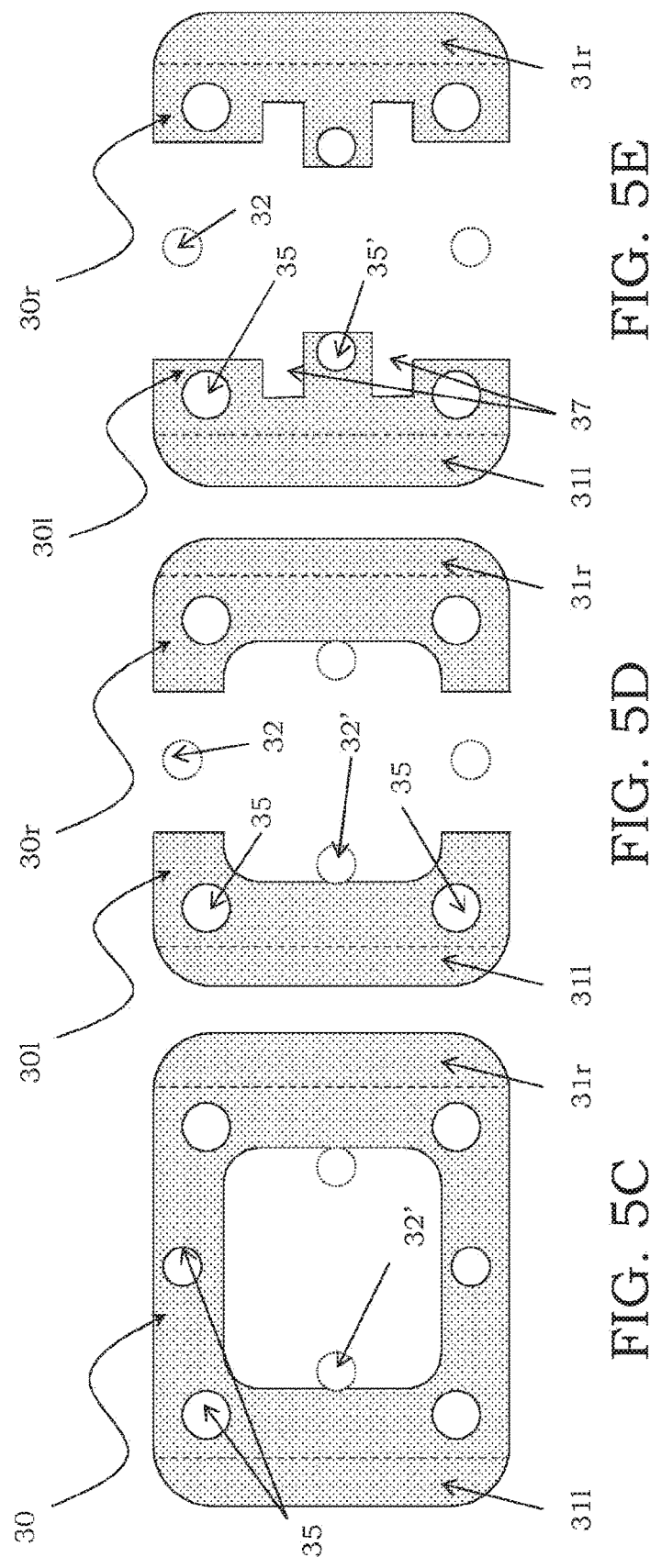
FIG. 5C
FIG. 5D
FIG. 5E

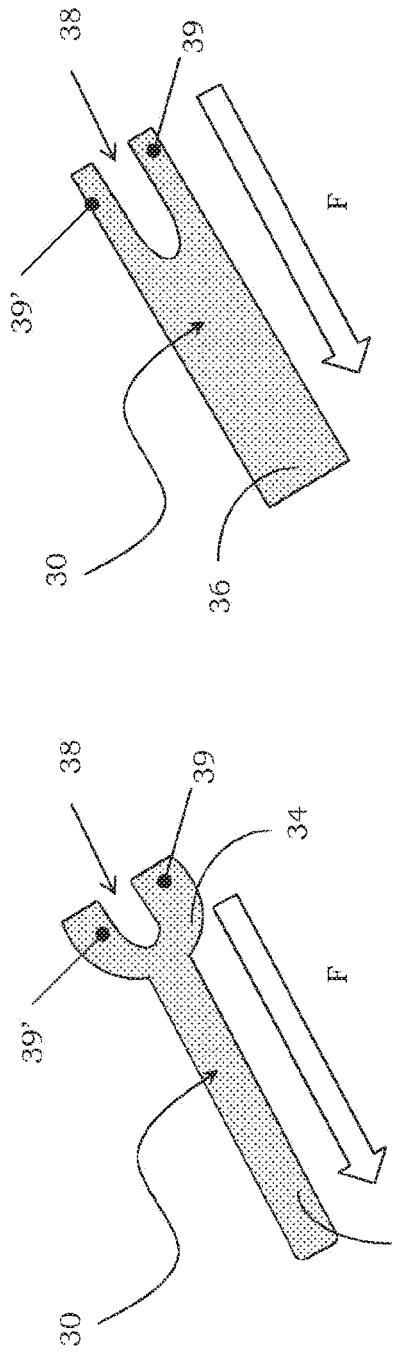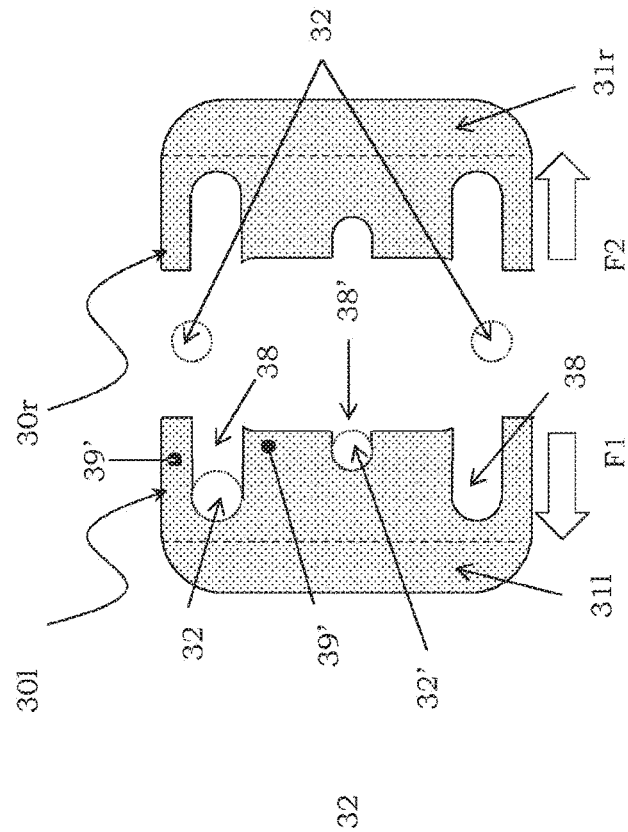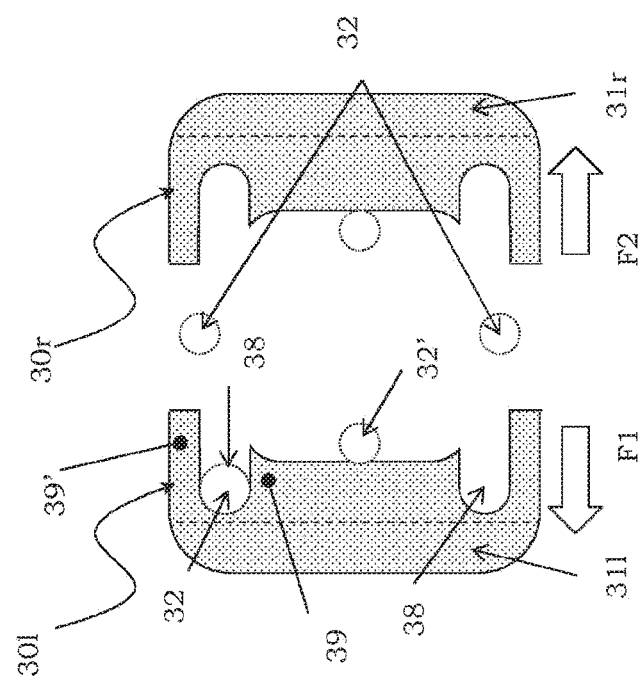

PROBE CARD FOR ELECTRONICS DEVICES

BACKGROUND

Technical Field

The present disclosure relates to a probe card for a testing equipment of electronic devices.

The disclosure relates in particular, but not exclusively, to a probe card comprising one testing head with vertical probes for the testing of electronic devices, in particular integrated on wafer and the following description is made with reference to this field of application with the only aim of simplifying its presentation.

Description of the Related Art

As is well known, a probe card is essentially a device adapted to put into electrical connection a plurality of contact pads of a microstructure, in particular an electronic device integrated on wafers, with corresponding channels of a testing equipment that performs its functionality check, in particular the electrical one, or generically the testing.

The test performed on integrated devices is particularly useful to detect and isolate flawed devices already in the manufacturing stage. Usually, the probe cards are thus used for electrically testing wafer integrated devices before their cutting and assembling in a chip containment package.

A probe card comprises in particular a testing head which in turn comprises a plurality of movable contact elements or contact probes held by at least a pair of plates or guides substantially in the shape of plates and parallel between each other. Such guides are equipped with apposite holes and located at a certain distance between them so as to leave a free zone or an air zone for the movement and possible deformation of the contact probes. The pair of guides comprises in particular an upper guide and a lower guide, the adjective "upper" and "lower" being used in the field with reference to a testing head during its working and corresponding to the illustration of the figures, the testing head being positioned between the testing equipment (above) and a wafer comprising the devices to be tested (below).

Both guides are equipped with guide holes wherein the contact probes slide axially, normally formed by wires of special alloys having good electrical and mechanical properties.

The testing head is further completed by an envelope or case arranged between the upper and lower guides, normally made in ceramic and adapted to contain the probes.

The good connection between the contact probes and respective contact pads of the device to be tested is assured by the pressure of the testing head on the device itself, i.e. on the wafer that comprises it, the contact probes, movable within the guide holes made in the upper and lower guide, being subjected to a bending in occasion of such pressing contact, within the free zone between the two guides and a sliding within such guide holes.

Testing heads of this kind are commonly named vertical probe heads.

Vertical probe heads substantially have a free zone wherein a bending of the contact probes happens, and is thus indicated as bending zone; the bending of the contact probes can be further helped by a suitable configuration of the probes themselves and/or a suitable positioning of the guides.

In some cases, the contact probes are bound to the testing head in correspondence to the upper guide in a fixed manner, for example by means of bonding: this is the case of blocked probe head.

More frequently, however, testing heads are used with probes that are not bound in a fixed manner, but held interfaced to a spatial transformation board of the probe card, commonly indicated as "space transformer": this is the case of unblocked probe head.

A probe card comprising an unblocked vertical probe head is schematically shown in FIG. 1, where for sake of illustration simplicity only one contact probe of the plurality of probes normally comprised in such testing head is illustrated.

In particular, the probe card 10 comprises the testing head 1 arranged between a space transformer 8 and a device to be tested 7 and in turn comprising at least one upper guide 3 and a lower guide 4, made by means of plate-shaped supports substantially plane and parallel between them and having respective upper guide holes 3A and lower guide holes 4A within which the respective contact probes 2 slide.

The testing head 1 also comprises a case 5, which functions as stiffener and that contains the contact probes 2 and is arranged between the upper and lower guides, 3 and 4. The case 5 in particular extends in correspondence of an air or bending zone 6 between such guides.

Each contact probe 2 has a substantially rod-like body 2C and at least one end or contact tip 2A. With the terms end and tip it is indicated here and beyond a not necessarily sharp end section. In particular, the contact tip 2A abuts onto a contact pad 7A of the device to be tested 7, making the mechanical and electrical contact between said device and a testing equipment (not represented) whose probe card 10 forms a terminal element.

In the example illustrated in FIG. 1, the contact probe 2 has a further contact end, usually indicated as testing head 2B, towards a plurality of contact pads 8A of the space transformer 8. The good electric contact between probes and space transformer is assured in a similar manner to the contact with the device to be tested by means of the pressure of the terminal portions, in particular of the tip or the head, of the contact probes on the respective contact pads.

The upper guide 3 and the lower guide 4 are opportunely distanced from the air or bending zone 6 that allows the deformation of the contact probes 2, the upper guide holes 3A and lower guide holes 4A being sized so as to allow the sliding of a respective probe inside them. A further zone called floating zone is defined between the upper guide 3 and the space transformer 8; such floating zone 9 is set so as to grant a movement of the contact heads 2B in occasion of the pressing contact of the testing head 1—and thus of the contact probes 2—onto the device to be tested 7, in particular of the contact tips 2A onto the contact pad 7A, still assuring the contact of the contact heads 2B with the contact pads 8A of the space transformer 8.

In the case of a testing head realized in the technology so-called "with shifted plates", the contact probes 2, also indicated as "buckling beams", are made as straight, with a transversal section constant for their whole length, preferably rectangular. It is known to realize this type of testing heads by superimposing the guides so as to put into correspondence the respective guide holes, insert the contact probes into such guide holes, distance the guides to form the bending zone and then offset or shift such guides, provoking a deformation of the body of the probes, in a substantially central position, as illustrated in FIG. 1. In this case, they are called shifted plate testing heads.

It is worth remembering that the proper working of a testing head, and thus of the probe card that contains it, is fundamentally bound to two parameters: the vertical movement, or overtravel, of the contact probes and the horizontal movement, or scrub, of the respective contact ends, in particular the contact tips 2A, whose scrub allows to superficially "clean" the contact pads 7A of the device to be tested 7, improving the contact made by the testing head 1 for its entire working life.

It is also important to ensure that the floating zone 9 of the contact probes 2B of the contact heads 2 is sized so as to ensure that these heads are properly contacted onto the contact pad 8A of the space transformer 8.

All these characteristics are to be evaluated and calibrated during the steps of manufacturing of a testing head, the good electrical connection between probes, device to be tested and space transformer always having to be guaranteed.

The contact ends of the contact probes, in particular the contact tips with the pads of the devices to be tested, are subjected to accumulation of material, generally indicated as dirt, during their use, which decreases their performance and may compromise the proper contact of the probes with the device to be tested, when the scrub of these tips is not able to provide electrical contact with the pads anyway.

It is therefore known to perform cleaning operations, in particular of the contact tips, by means of abrasive cloths.

Obviously, such cleaning operations involve the consumption of a portion of the terminal portion of the probes, in particular of the contact tip, and are therefore limited in number precisely by the length of that tip, which becomes shorter at each cleaning. In particular, any subsequent abrasion of the terminal portion, namely of the contact tip, should be limited to the tapered probe portion projecting from the lower guide toward the device to be tested, which indeed realizes the contact tip.

The number of cleaning operations of the testing head actually determines its working life and consequently the working life of the probe card that contains it.

It is known from the U.S. Patent Publication US 2015/309076 on behalf of the present Applicant to use a spacer element, removably interposed between the containment element and one of the upper and lower guides, so as to adjust the length of the terminal portions of the contact probes, in particular, in correspondence of the contact tips.

Although advantageous in various respects, such testing head has a drawback due to the fact that the variation in the length of the terminal portions by means of the removal of the spacer or of a layer thereof inevitably also modifies the air or bending zones of the contact probes, thereby modifying the contact dynamics and introducing problems in terms of the force exerted by the probes on the contact pads and also of the scrub allowed on them, in addition to modifying the deformation suffered by the probes in such free zone, with the risk of permanent deformations or entrapments of such probes in the respective guide holes.

Also known from the Japanese patent application published under No. JP 2015 025749 on 5 Feb. 2015 in the name of Micronics Japan Co. Ltd. is a probe card including a spacer disposed so as to be attachable/detachable between a holder and a wiring board; in particular, the spacer is provided with a tab portion protruding outside the holder and having a shape protruding downward, so that the removing of the spacer becomes easy.

Furthermore, the European Patent Application published under No. EP 1 197 756 on 17 Apr. 2002 in the name of Nihon DKK describes a vertical probe card which comprises a lower guide composed by three substrates laminated separately, a substrate being separated from the lower guide plate in case a probe is broken so as to enable such a broken probe to sufficiently project from the lower guide to newly correctly work.

BRIEF SUMMARY

It is an object of the present disclosure to provide a probe card for electronic devices integrated on wafers, having structural and functional characteristics so as to allow an adequate number of cleaning operation of the contact probes comprised into the corresponding testing head without functional loss, overcoming the limitations and the drawbacks that still afflict the testing heads realized according to the prior art, in particular by guaranteeing a constant exerted force and the essential scrub mechanisms for a proper contact between probes and contact pads throughout the entire working life of the probe card, even in case of subsequent cleaning operations.

The probe card comprises at least one spacing element or spacer, set inside the card, easily removable and possibly peelable, the removal of which, even a partial one, does not modify the extension of the bending zone of the probes, and thus the force that they exert.

According to an aspect of the disclosure the probe card for a testing equipment of electronic devices comprises at least one testing head arranged between a device to be tested and a spatial transformation layer or space transformer, the testing head comprising a plurality of contact probes inserted into guide holes being realized in at least one upper guide and in a lower guide and at least one spacer element interposed between the spatial transformation layer and the upper guide.

More specifically, the testing head is provided with a plurality of contact probes inserted into guide holes made in at least one upper guide and in a lower guide, a bending zone of the contact probes being defined between said upper and lower guides. In addition, each of the contact probes has at least one first terminal portion projecting from the lower guide with a first length and ending with a contact tip adapted to abut onto a respective contact pad of a device to be tested, as well as one second terminal portion projecting from the upper guide with a second length and ending with a contact head adapted to abut onto a contact pad of the space transformer.

Suitably, the probe card according to the present disclosure may further comprise at least one spacer element interposed between the space transformer and the upper guide of the testing head, such spacer element being removable to adjust the first length of the first terminal portion of the contact probes by changing the second length of the second terminal portion of the contact probes, removing the spacer element allowing an approach of the testing head, in particular of the upper guide, to the space transformer, indeed.

According to another aspect of the disclosure, the spacer element may have a height smaller than or equal to the second length of the second terminal portion of the contact probes.

Such spacer element may also have at least one projecting portion from the testing head and in particular from the upper guide.

Additionally, the spacer element may comprise a plurality of layers, overlapping and individually removable.

Such layers may be joined to one another, for example by means of a layer of adhesive material.

Additionally, the spacer element may be joined to the upper guide, for example by means of a layer of adhesive material.

According to another aspect of the disclosure, layers of the spacer element may have respective projecting portions from the testing head and in particular from the upper guide.

In particular, such projecting portions of such layers may have different lengths from one another.

Furthermore, the layers may have a numbering put onto a face of the respective projecting portions, such numbering being written or engraved or embossed or made by means of any other technique on the projecting portions or being one or more distinctive marks, formed by notches or reliefs, of any form and made with any suitable technique, in the number corresponding to the desired numbering.

According another aspect of the disclosure, the probe card may further comprise retaining means adapted to join the space transformer with the testing head, as well as the spacer element, equipped with suitable housing seats for the retaining means.

In particular, the housing seats of the retaining means may be holes and/or open housings having dimensions suitable for housing such retaining means.

Additionally, such housing seats may be positioned in correspondence of a perimeter portion of the upper guide and/or in a central portion of the upper guide, being contiguous, concentric with respect to the perimeter portion.

According to another aspect of the disclosure, the spacer element may have an elongated shape, being substantially rectangular.

More specifically, the spacer element may have a shape chosen between a paddle formed by an elongated body and by a head and a tab.

Alternatively, the spacer element may comprise a frame substantially extended as the upper guide.

Suitably, such frame forming the spacer may be sized so as to project with respect to the testing head and in particular to the upper guide or to comprise at least one elongated portion projecting with respect to the testing head and in particular to the upper guide.

According to another aspect of the disclosure, the spacer element may comprise at least one pair of semi-frames substantially extending along the opposite sides and parallel to the upper guide, such semi-frames that form the spacer element being sized so to project with respect to the testing head and in particular to the upper guide or at least one elongated portion adapted to project with respect to the testing head and in particular to the upper guide.

According to another aspect of the disclosure, the spacer element may be made of a plastic material, transparent or semi-transparent, or of a ceramic material, or of a metallic material or of an organic material or silicon, preferably of Kapton®.

Moreover, the probe card may include a plurality of spacer elements being arranged on the upper guide in positions, numbers and shapes so as not to interfere with the proper working of the contact probes and therefore of the probe card that includes it.

A method of restoring a probe card comprises at least one testing head with a plurality of contact probes inserted into guide holes realized in at least one upper guide and a lower guide as well as at least one space transformer with a plurality of contact pads, each of the contact probes having at least one first terminal portion projecting from the lower guide with a first length and ending with a contact tip adapted to abut onto a respective contact pad of a device to be tested as well as one second terminal portion projecting from the upper guide with a second length and ending with a contact head adapted to abut onto one of the contact pads of the space transformer, such probe card further comprising at least one spacer element interposed between the space transformer and the upper guide of the testing head, in case comprising a plurality of layers, overlapped and individually removable the method being characterized in that it comprises the steps of:

de joining the space transformer from the testing head, in particular from the upper guide;

removing the spacer element or one of the layers composing it;

approaching the upper guide and the space transformer; and joining again the testing head and the space transformer, so as to adjust the first length of the first terminal portion of the contact probes by changing the second length of the second terminal portion of the contact probes and restoring a proper working of the testing head and therefore of the probe card including it.

In particular, the step of removal may comprise slipping the spacer element or one of the layers composing it off.

The characteristics and the advantages of the probe card according to the disclosure will result from the description, made below, of one embodiment thereof, given in an indicative and non limitative way with reference to the annexed drawings.

BRIEF DESCRIPTION OF THE SEVERAL VIEWS OF THE DRAWINGS

FIGS. 5A-5E schematically show in respective top views alternative embodiments of a detail of the probe card realized according to the disclosure;

FIGS. 6A-6D schematically show in respective top views further alternative embodiments of a detail of the probe card realized according to the disclosure.

DETAILED DESCRIPTION

Figure 1:
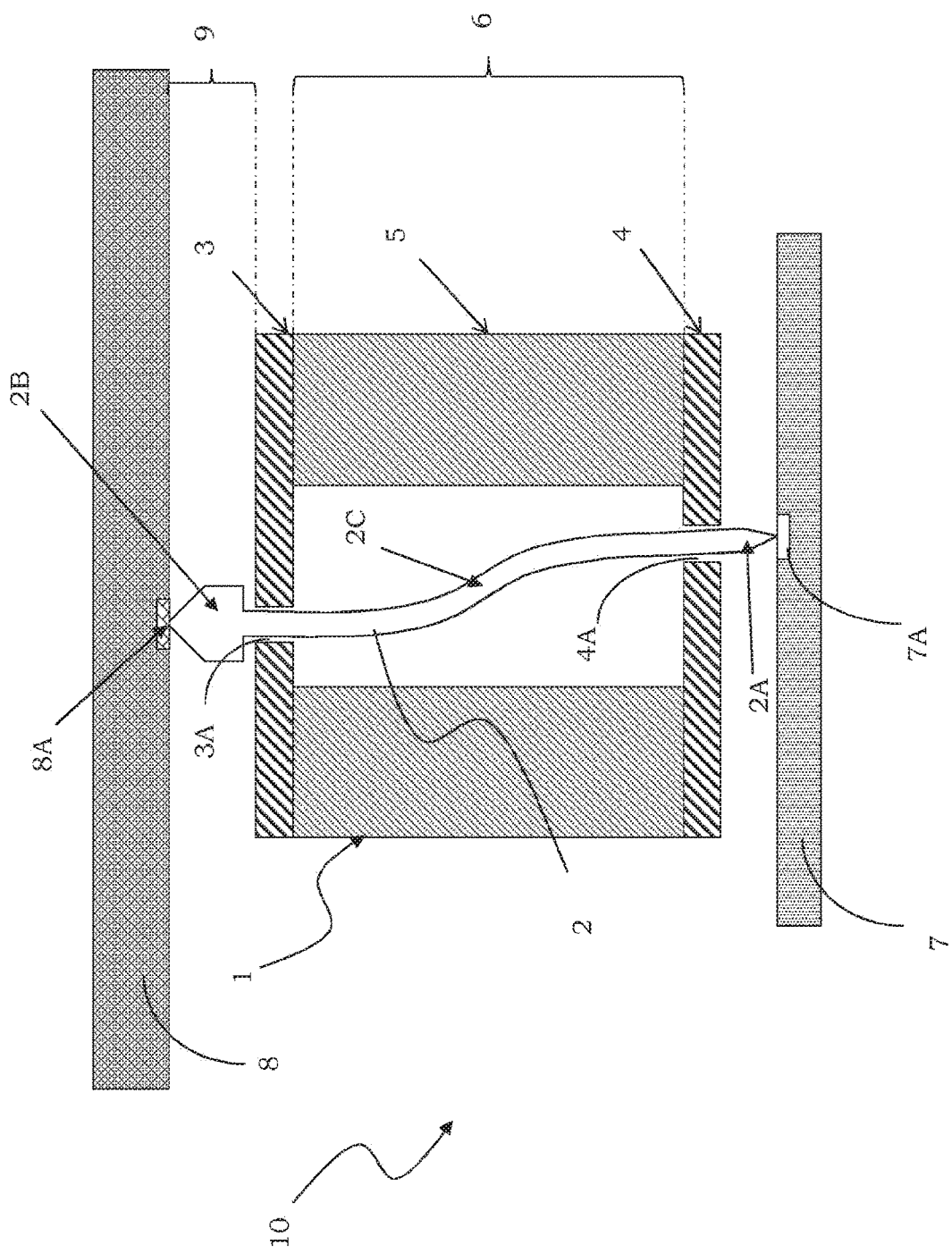
FIG. 1 schematically shows a testing head of electronic devices, in particular integrated on wafers, realized according to the known art.
Figure 2:
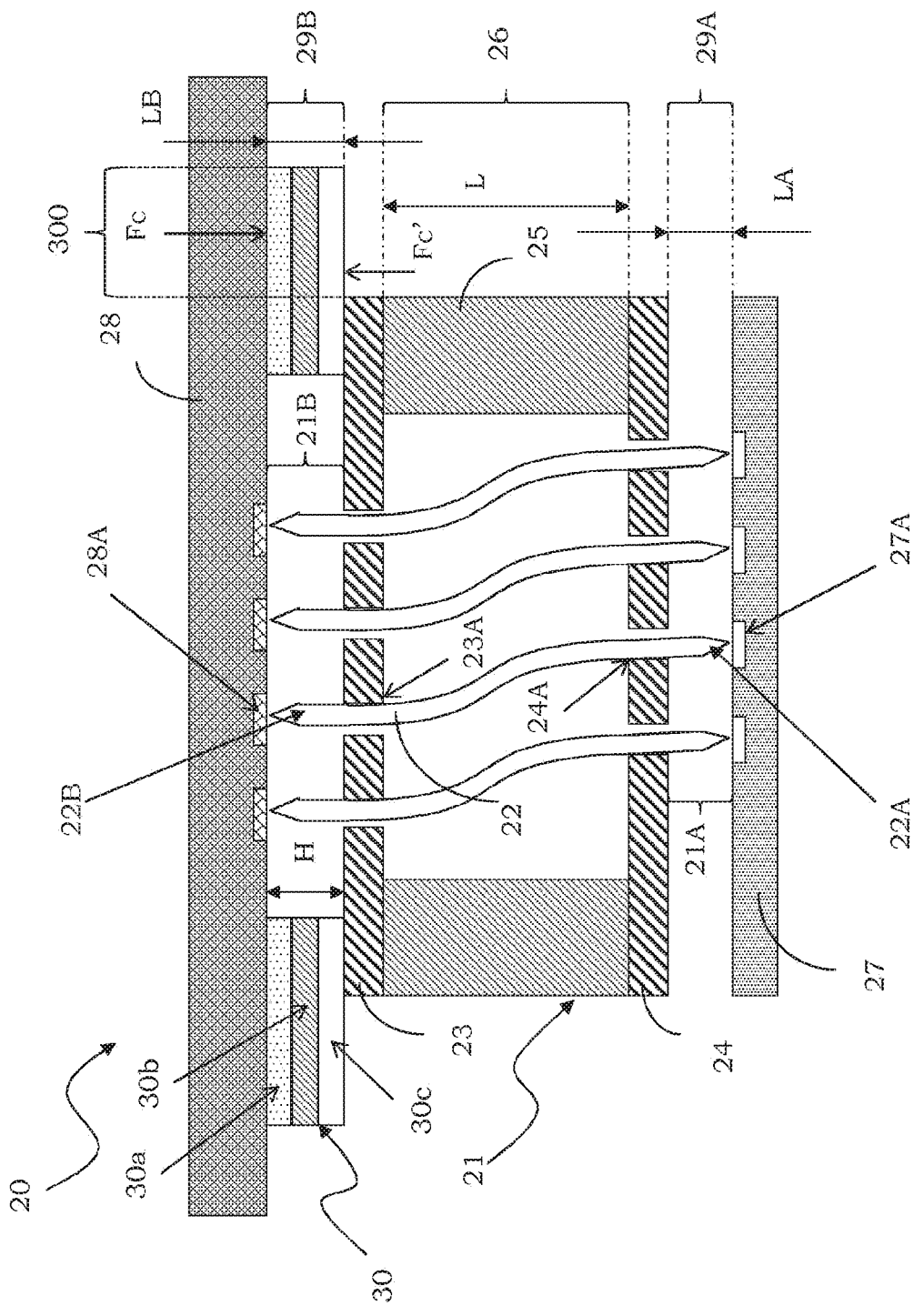
FIG. 2 schematically shows a section view of a probe card, realized according to an embodiment of the disclosure.

With reference to such figures, and in particular to FIG. 2, reference 20 globally indicates a probe card realized according to the disclosure.

It should be noted that the figures are schematic views and are not drawn in scale, but are instead drawn to emphasize the important features of the disclosure. Furthermore it should be noted that arrangements shown with reference to a particular embodiment can obviously be used in combination with other embodiments. Finally, same numeral references are used in the different figures to indicate structurally and functionally corresponding elements.

The probe card 20 comprises a testing head 21, in turn comprising a plurality of contact probes 22. The testing head also comprises at least one upper guide 23 and a lower guide 24, having respective guide holes 23A and 24A within which the contact probes 2 slide, and is provided with a containment element or case 25 extended between such guides.

Between the upper guide 23 and the lower guide 24, an air or bending zone 26 is defined, wherein the contact probes 22 may further deform in occasion of the pressing contact of the probes onto the device to be tested 27.

The depicted testing head 21 is indeed of the "with shifted plates" kind and the upper guide 23 and lower guide 24 are opportunely shifted, the contact probes 22 housed in the respective guiding holes of said guides being thus pre-deformed and being subjected to, in occasion of the contact between the testing head 21 and the device to be tested 27, a further bending and deformation.

In particular, the testing head 21 illustrated in FIG. 2 is of the unblocked vertical probe type and each contact probe 22 has respective terminal portions 21A and 21B adapted to make a mechanical and electric contact with respective contact pads; in particular, a first terminal portion 21A ends with a contact tip 22A adapted to abut onto a contact pad 27A of the device to be tested 27, while a second terminal portion 21B ends with a contact head 22B adapted to abut onto a contact pad 28A of a space transformation layer or space transformer 28. In this way, the contact probes 22 make the mechanical and electric contact between the device to be tested 27 and a testing device (not represented), the probe card being a terminal element thereof. With the wording "terminal element" it is meant, here and in the following, a part of the contact probes 22 that projects with respect to the guides 23, 24 and thus to the case 25, in particular in direction of the device to be tested 27 or of the space transformer 28, respectively. Moreover, as previously highlighted, with the term tip it is indicated a not necessarily sharp terminal portion.

The first terminal portion 21A of the contact probes 22 in correspondence of the contact tip 22A extends in a first zone 29A between the lower guide 24 and the device to be tested 27; in particular, the first terminal portion 21A projects from the lower guide 24 with a suitable first length LA, with reference to an ideal plan determined by the device to be tested 27 in pressing contact with the testing head 21, corresponding to the length of the first zone 29A when the testing head 21 is in pressing contact onto the device to be tested 27. Such first zone 29A allows a movement of the contact tips 22A of the contact probes 22 on the contact pad 27A of the device to be tested 27 during the working of the testing head 21 and of the probe card 20 that comprises it and is thus indicated as scrub zone 29A.

It is to be noted that the first terminal portion 21A gradually reduces its length LA as the testing head 21 is used by virtue of the passages of its tips on an abrasive cloth, as explained in relation to the prior art. Substantially, the first terminal portion 21A is consumed during every cleaning operation of the relative contact tip 22A.

Similarly, the second terminal portion 21B of the contact probes 22 in correspondence of the contact head 22B extends in a second zone 29B between the upper guide 23 and the space transformer 28; in particular, the second terminal portion 21B projects from the upper guide 23 with a suitable second length LB, with reference to an ideal plan determined by the space transformer 28, such second length LB corresponding to the length of the second zone 29B when the testing head 21 is in pressing contact with the space transformer 28, in a manner similar to the device to be tested 27. This second zone 29B allows movement of the contact heads 22B of the contact probes 22 during the working of the testing head 21 and of the probe card 20 that comprises it and is thus indicated as a floating zone 29B.

As already indicated, during the test operations carried out by the probe card 20, that is when the testing head 21 is in pressing contact with the device to be tested 27 and with the space transformer 28, the contact probes 22 bend at the bending zone 26, which is extended between the upper guide 23 and the lower guide 24 and has an additional length L corresponding to the height of the case 25. The upper guide 23 and the lower guide 24 may also comprise a plurality of guides, plate-shaped and parallel with each other, suitably separated by local free zones.

Advantageously, according to the disclosure, in the embodiment schematically illustrated in FIG. 2, the probe card 20 further comprises at least one spacing element or spacer 30, arranged between the upper guide 23 and the space transformer 28 in correspondence of the floating zone 29B and having a height H substantially corresponding to the second length LB of the floating zone 29B, in particular smaller than or equal to such second length LB (H<LB). More in particular, the probe card 20 comprises at least a couple of spacers 30 arranged on opposite sides of the testing head 21, as illustrated in FIG. 2.

More in general, the probe card 20 comprises a plurality of spacers 30 arranged between the testing head 21 and the space transformer 28.

Such spacers 30 can be made for example of a plastic material, in case transparent or semi-transparent, of a ceramic material, of a metallic material, of an organic material or of silicon, preferably of Kapton®.

Moreover, the spacers 30 can be made in such way as to have portions 300 projecting with respect to the testing head 21, and thus to the upper guide 23, so as to simplify the gripping and the removal of the spacers themselves, once removed the testing head 21 from the probe card 20 and thus decoupled from the space transformer 28, as will be explained below.

Opportunely, the spacers 30 comprise one or more layers that are overlaid or aligned with each other and singularly removable or peelable; the layers composing the spacers 30 can simply be laid one on another, or in case joined among them by means of appropriate means, for example an adhesive material, such as glue, in particular with a reduced sealing force, so as to allow the separation of the layers one from another in an easy manner. The probe card 20 of FIG. 2 comprises spacers 30 composed by three layers, indicated as 30a, 30b and 30c, meant as a non-limiting example, the spacers 30 being able to comprise any number of layers, in case even just one. Preferably, the layers 30a-30c have equal thickness, the sum of the thicknesses of all the layers 30a-30c determining the height H of the spacer 30.

Obviously, it is possible to consider layers having different thickness one from another, the sum of the thicknesses of all the layers still determining the height H of the spacer 30. Optionally, films of adhesive materials, in particular with a reduced sealing force, are interposed between such layers.

Advantageously, according to the present disclosure, the probe card 20 equipped with a spacer 30 as described above allows to regulate the length LA of the first terminal portions 21A of the contact probes 22, thus overcoming the problem of the consumption of the contact tips 22A during the working life of the probe card 20.

It is in fact possible to remove one or more layers of the spacers 30 for a desired adjustment of the length LA of the first terminal portions 21A of the contact probes 22. In particular, it is possible to remove the testing head 21 from the probe card 20 and thus to decouple it from the space transformer 28 to expose the spacers 30, removing one or more layers composing the spacer 30 and subsequently to reassemble the testing head 21 and the space transformer 28, thus reassembling the probe card 20: the removal of one or more layers of the spacers 30 reduces the height H of the spacers 30 themselves and thus the second length LB of the floating zone 29B, pushing the contact probes 22 towards the device to be tested 27 when the space transformer 28 is repositioned on the testing head 21, i.e. reinstating the first length LA of the first terminal portion 21A of such probes, length that was shortened because of the consumption of the contact probes 22 in correspondence of the respective contact tips 22A.

Figure 3A:
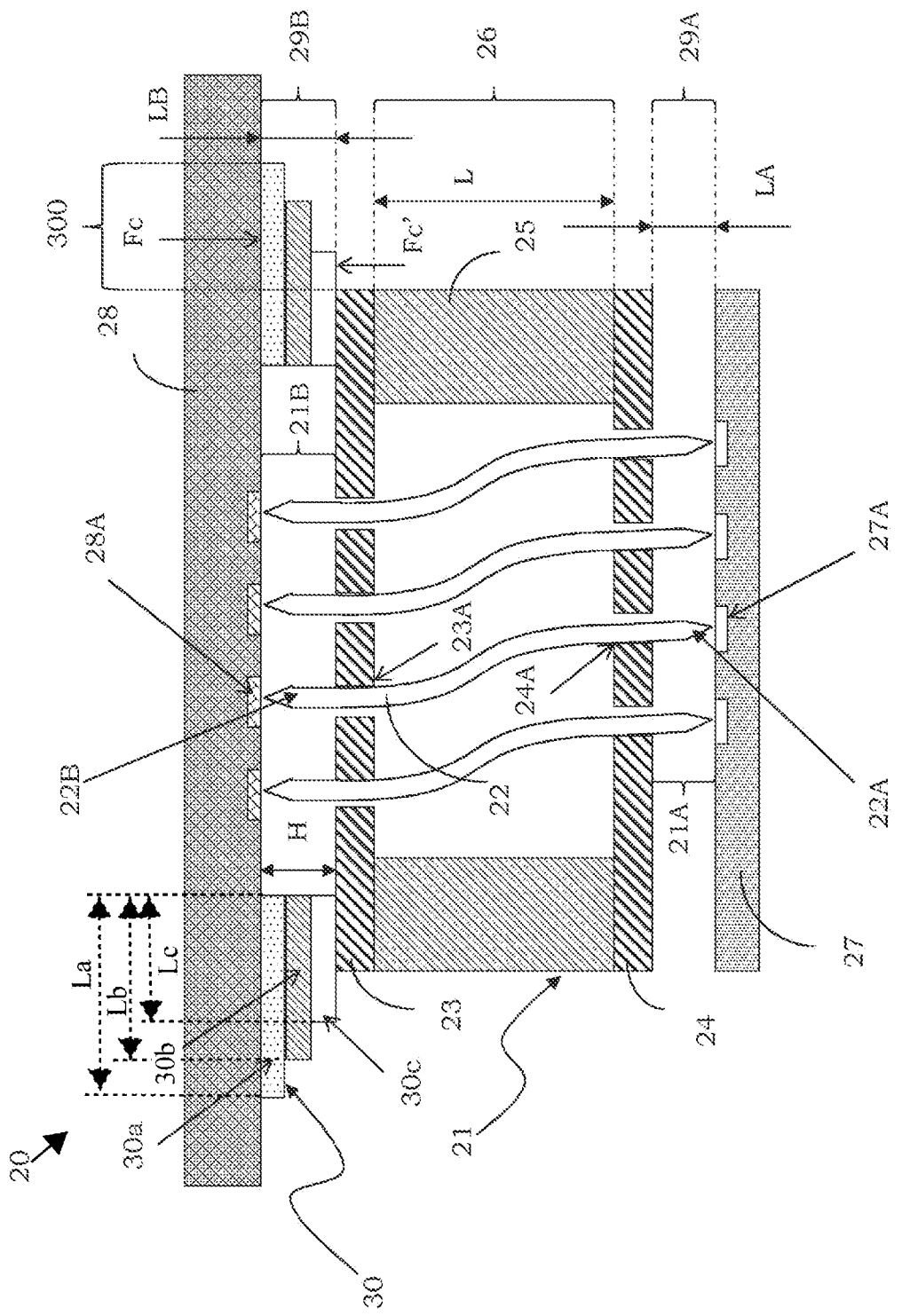
FIGS. 3A-3D schematically show respective section views of alternative embodiments of the probe card realized according to the disclosure.

Suitably, the layers 30a-30c of the spacers 30 can be made in such way as to have projecting portions 300 from the testing head 21. In the alternative embodiment illustrated in FIG. 3A, such projecting portions 300 have different lengths from one layer to another of a same spacer 30, so as to ease the removal of the same number of layers for the different used spacers 30. Suitably, such projecting portions 300 have equal lengths for corresponding layers of the different spacers 30, for example the projecting portion of the layer which is closer to the space transformer 28 of all spacers 30 has a same length, such length being still major than that of the following layers, gradually closer to the upper guide 23. In particular, such projecting portions 300 have a gradually decreasing length from the layer closer to the space transformer 28 to that closer to the upper guide 23. More particularly, the layers 30a-30c of the spacers 30 have projecting portions 300 from the testing head 21 with gradually increasing or decreasing lengths from one another and provide the layers 30a, 30b, 30c with graduated lengths of La, Lb, Lc, respectively.

It is also possible to provide a numbering for such layers 30a-30c, for example with increasing numbering starting from the closest one to the space transformer 28, this numbering being in particular applied to the projecting portion 300 of the spacer 30, for example, in correspondence of its face Fc facing the space transformer 28. Thus, by looking at the testing head 21 from the side of the space transformer 28, once the testing head 21 has been removed from the probe card 20, it is immediately possible to verify that all the spacers 30 comprise the desired number of layers simply by reading that numbering on all the projecting portions 300 of the layers of such spacers 30 closest to the space transformer 28. Such numbering may be in the form of a number written or engraved or made by means of embossing or any other technique on these projecting portions 300. Alternatively, the numbering may include a plurality of distinctive signs, such as notches or reliefs, of any form and made by means of any suitable technique, in the number corresponding to the desired numbering; In this case, for example, a layer identified as the first layer, such as layer 30a of FIG. 3A, comprises only one notch or relief, such as an engraved or embossed spot; similarly, the second layer 30b may have two engraved or embossed spots and the third layer 30c, three engraved or embossed spots.

Figure 3B:
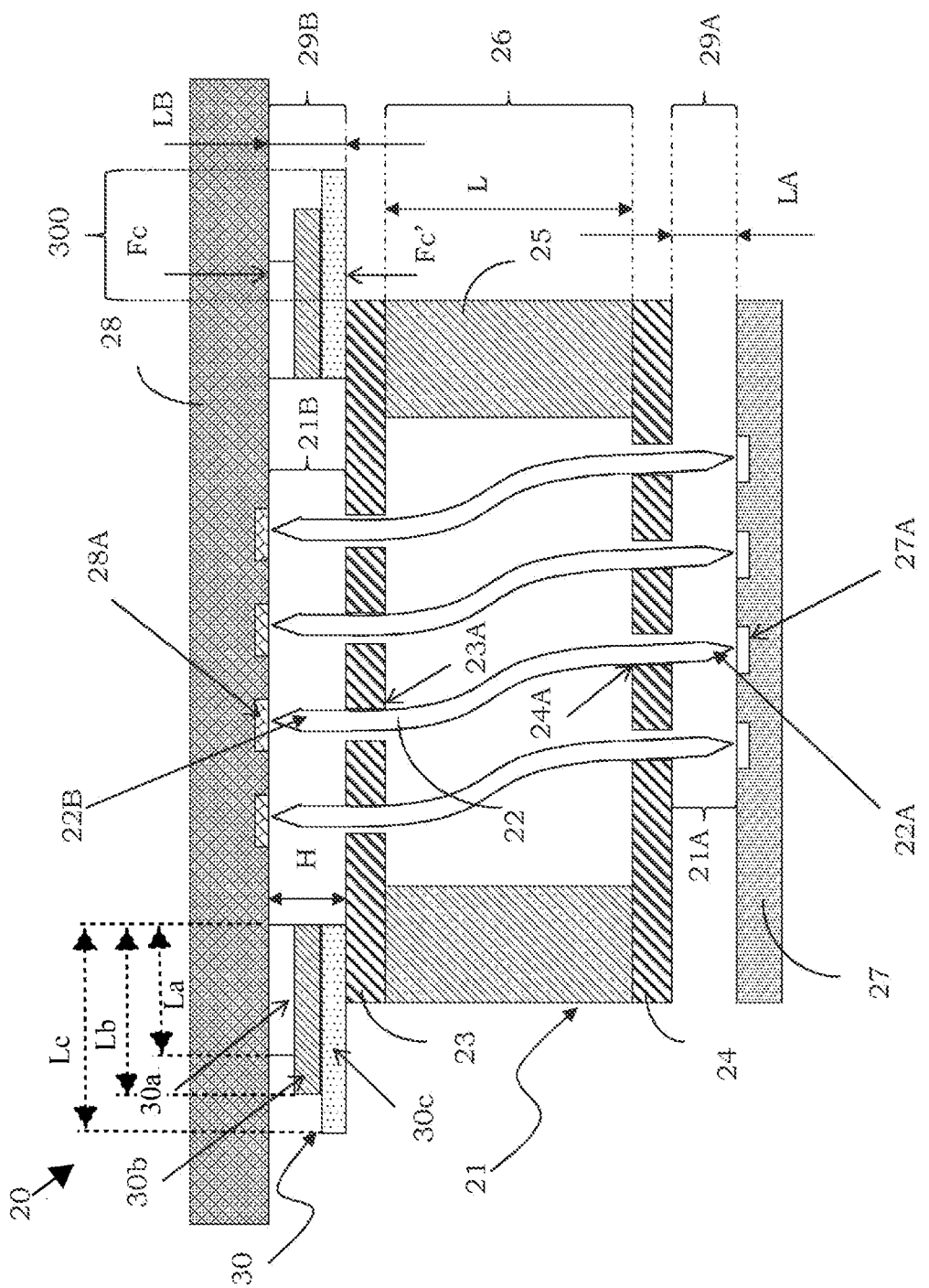

It is of course possible to consider spacer 30 with projecting portions of increasing lengths from the layer closest to the space transformer 28 to the one closest to the upper guide 23 as schematically shown in FIG. 3B.

It is also possible to apply the numbering to the layers 30a-30c of the spacer 30 at an opposite face Fc' opposite with respect to the face Fc, particularly facing the testing head 21.

Figure 3C:
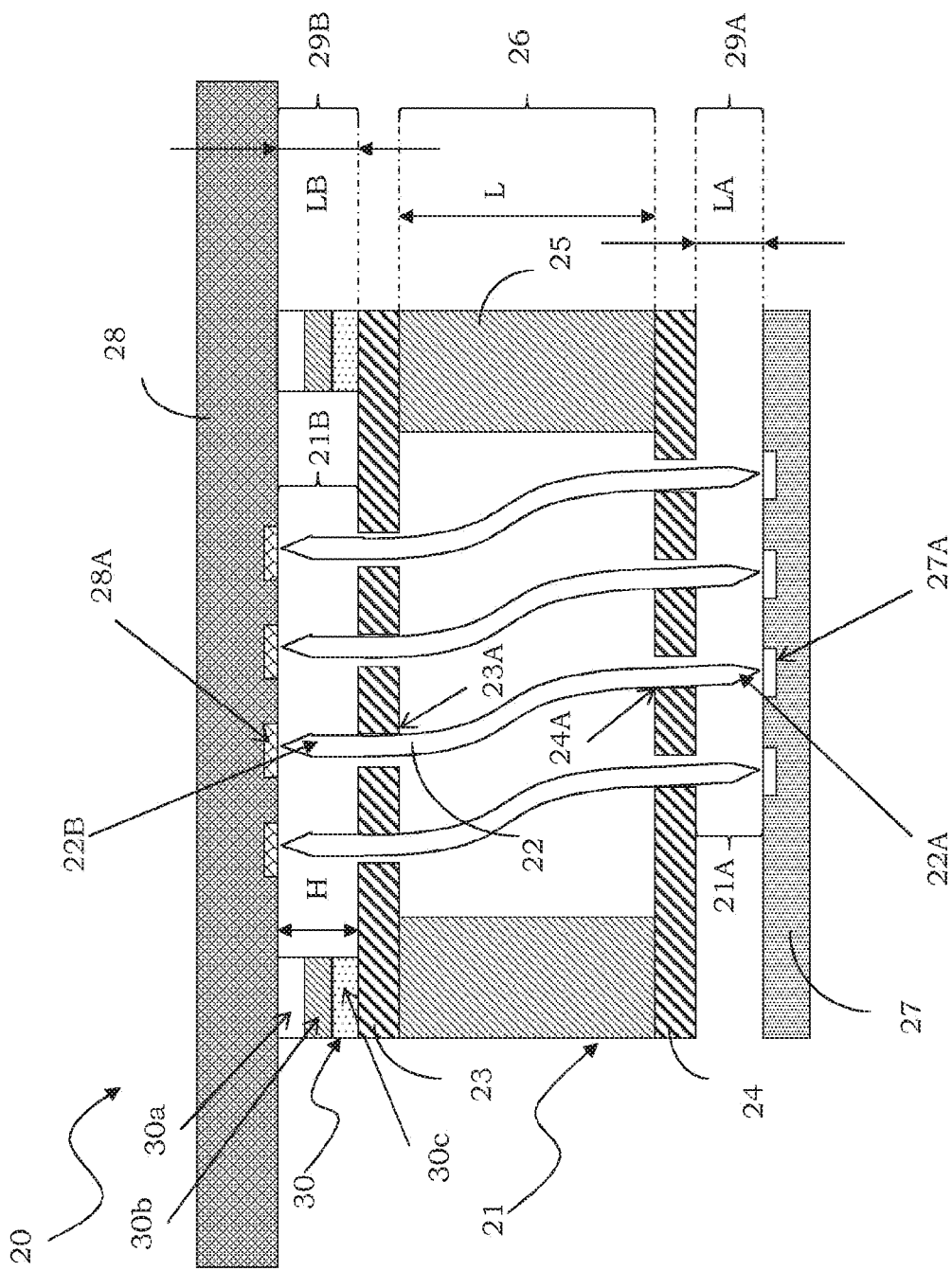

In an alternative embodiment, the spacers 30 have a substantially columnar shape with one or more layers of the same length completely contained in the size of the testing head 21, as schematically illustrated in FIG. 3C.

Advantageously, such spacers 30 can comprise suitable means, for example at least one adhesive layer capable of associating them to the upper guide 23, by means of a simple pressure, or simply being laid to such upper guide 23. In the case when the spacer 30 comprises a plurality of layers 30a-30c, as illustrated for example in FIG. 3C, it is also possible to provide suitable means, in particular a plurality of adhesive layers, adapted to join such layers 30a-30c one other. Such layers 30a-30c can be made, for example, of Kapton®.

Figure 3D:
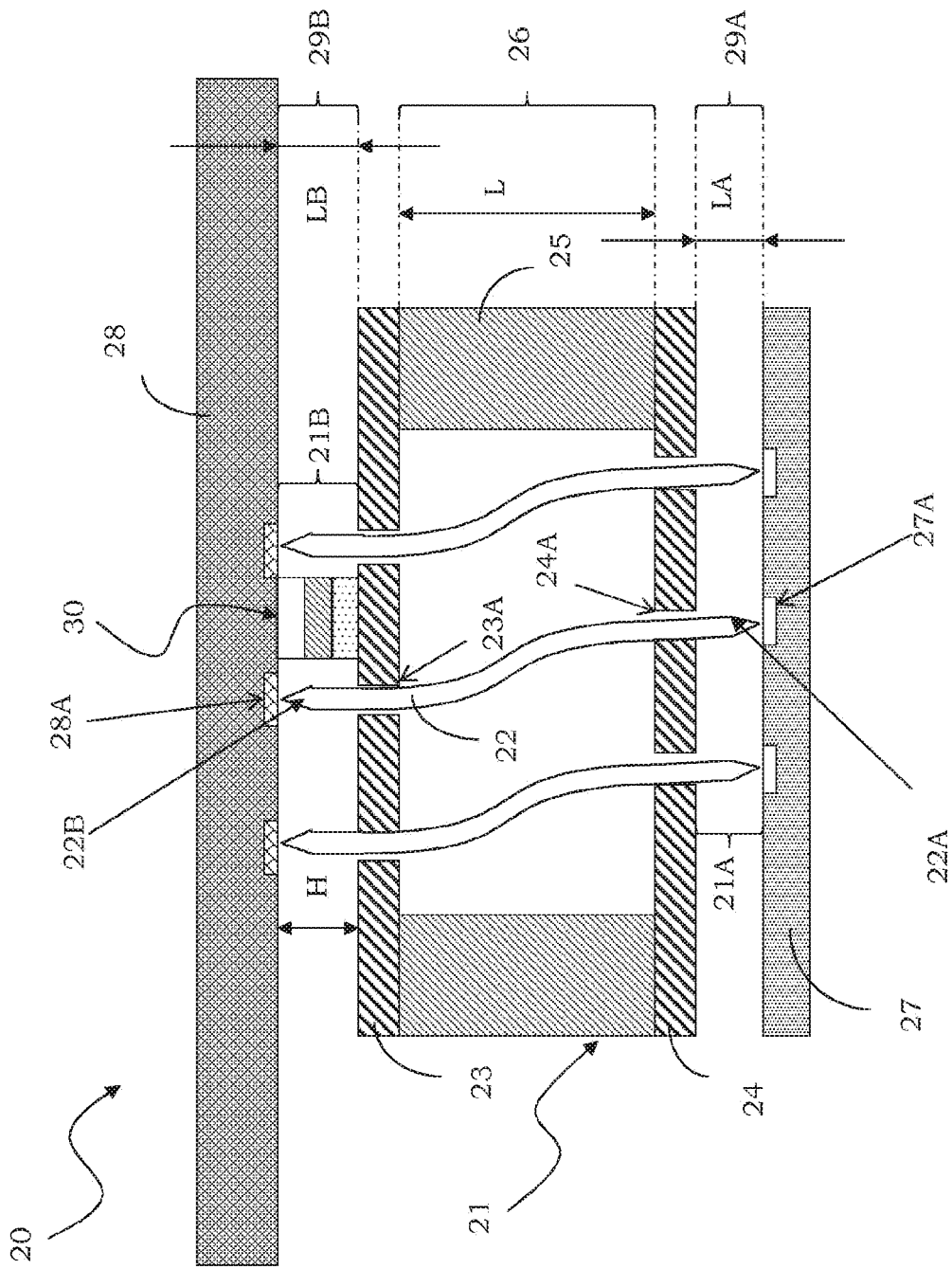

Such columnar spacers 30 may be suitably sized so as to be arranged in different positions of the upper guide 23, not necessarily at one of its edge portions, as schematically shown in FIG. 3D. Number and position of such spacers 30, as well as their form, will be chosen on the basis of the design of the testing head 21, in such way so as not to interfere with the proper working of the contact probes 22.

Although not shown in the figures, it is of course possible to realize the contact heads 22B of the contact probes 22 so as to have at least one portion with a diameter larger than the upper guide holes 23A realized in the upper guide 23 so as to prevent the probes from escaping even in the absence of a device to be tested 27 which such probes abut onto, the diameter being a maximum transverse dimension of a section of that portion orthogonal to a longitudinal development axis of the contact probe, as shown, for example, in relation to the prior art.

The probe card 20 also comprises respective retaining means 32 adapted to join the various components of such probe card, in particular the space transformer 28 and the testing head 21, more particularly its upper guide 23, as well as the spacers 30, equipped for this purpose with suitable housing seats for the retaining means 32.

Figure 4:
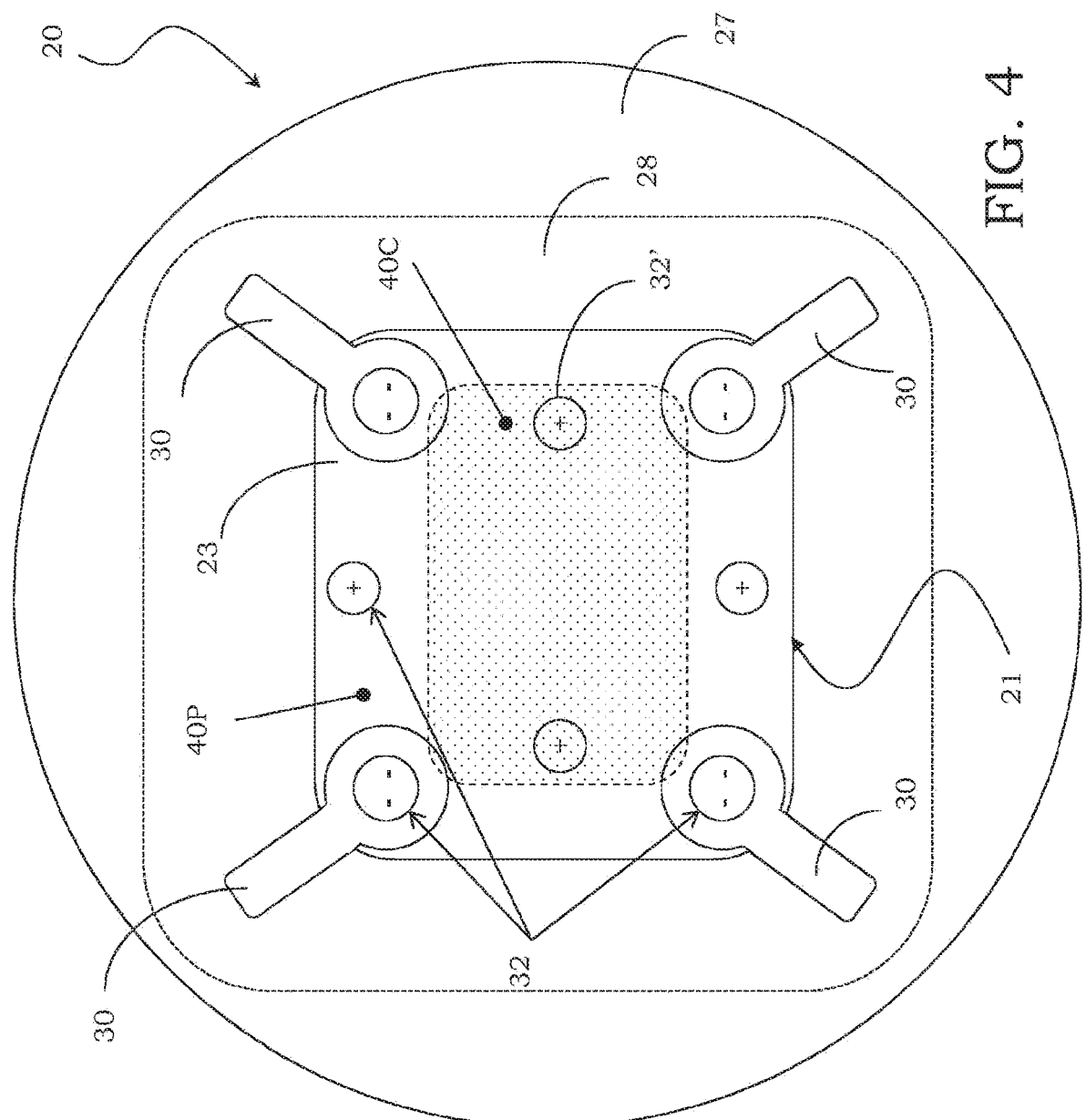
FIG. 4 schematically shows a top view of the probe card according to the disclosure.

As illustrated in FIG. 4, wherein the probe card 20 is shown from the side of the space transformer 28, with the same being made transparent, the retaining means 32 are substantially arranged along a perimeter portion 40P of the upper guide 23 having an essentially ring-shaped form. In the illustrated example, the probe card 20 comprises spacers substantially realized in paddle-shape in correspondence of the vertex of the upper guide 23 in a substantially rectangular shape. Retaining means 32' positioned in a central portion 40C of the upper guide 23, contiguous and concentric to the perimeter portion 40P and corresponding in practice to the area occupied by the contact probes 22 are also provided. The retaining means 32, 32' can for example be realized by means of screws, particularly flat-headed, housed in respective threaded holes.

It is of course possible to consider different configurations for the spacers 30, which can be arranged in different numbers and at different positions, symmetrically or not, with respect to those shown in FIG. 4.

It is also possible to use an additional adhesive film to associate the spacer 30 with the upper guide 23, thereby avoiding the spacer being crossed by the retaining means 32, 32'. This kind of solidarization between the spacer 30 and the upper guide 23 by means of an adhesive film is particularly convenient in the case of column spacers 30, such as those shown in FIGS. 3C and 3D, particularly when positioned within the central portion 40C of the upper guide 23, such as those shown in FIG. 3D, the retaining means 32' positioned in such central portion 40C being limited in number to not interfere with the normal working of the contact probes 22 included in the testing head 21.

In a particularly simplified embodiment, the spacers 30 are simply laid to the upper guide 23, their holding in position being assured by the pressing contact with the space transformer 28, once the testing head 21 is positioned in the probe card 20. Even in case the spacers 30 are formed by a plurality of layers 30a-30c, it is possible to simply superimpose them to each other on the upper guide 23, the superimposed layers 30a-30c being then held in position thanks to the pressure exerted by the upper guide 23 and by the space transformer 28.

A spacer 30 can conveniently have the shape of a paddle, as schematically illustrated in FIG. 5A.

In this case, the spacer 30 comprises an elongated body 33 and a head 34, for example circular, possibly bearing a hole 35 having such dimensions to be crossed by the retaining means 32, 32'. Such form of the spacers 30 results particularly advantageous, allowing an easy gripping of the spacers in correspondence of the elongated body 33 at time of their removal. Such elongated body 33 is indeed projecting with respect to the testing head 21, particularly to the upper guide 23. Furthermore, the major dimensions of the head 34 with respect to the elongated body 33 guarantee a good repartition of the pressure loading in occasion of the tightening of the respective retaining means 32, 32'.

It is also possible to realize the spacers 30 as substantially rectangular tabs 36, possibly equipped with holes 35 to allow the passage of the retaining means 32, 32', as schematically illustrated in FIG. 5B.

The paddle-like and tab-like embodiments define spacers 30 of substantially rectangular elongated shape, and in particular having a dimension much greater than the other. Such spacers 30 have a superficial area smaller than the guides, in particular the upper guide 23, in particular much smaller than another guide or layer of the testing head 21.

The spacers 30 realized by means of paddles or tabs are constructively very simple and allow to contemplate their distribution in the desired positions with respect to the testing head 21 and to the space transformer 28, by virtue of their contained transversal dimension, as well as a proper gripping of the same by virtue of the elongated longitudinal dimension that projects with respect to the testing head 21.

Alternatively, the spacers 30 can be realized by means of frames, having dimensions for example corresponding to the dimensions of the perimeter portion 40P of the upper guide 23. Such frames may opportunely be equipped with a plurality of holes 35 for the passage of the retaining means 32 in the contemplated positions, as schematically illustrated in FIG. 5C. Suitably, such frames that realize the spacers 30 may be sized so as to project with respect to the upper guide 23, so as to be easily grippable; moreover, this way it is possible to contemplate applying a numbering onto the spacers 30, in particular on any of the layers composing them, as previously explained.

More in particular, the frame that makes the spacer 30 comprises respective lateral portions 311, 31r that project with respect to the testing head 21, and in particular to the upper guide 23, as indicated in FIG. 5C.

Such spacers 30 realized by means of frames turn out to be structurally more solid with respect to the paddles or the tabs, by virtue of their greater area with respect to the overall area of the testing head 21.

It is also possible to realize the spacers 30 in the shape of pairs of semi-frames 301 and 30r, substantially extended along opposite and parallel sides from the testing head 21 and in particular of the upper guide 23. Also the semi-frames may be equipped with holes 35 for the passage of the retaining means 32 in the contemplated positions, as schematically illustrated in FIG. 5D. Also in this case, the semi-frames that realize the spacers 30 can be sized so as to project with respect to the testing head 21, in particular to the upper guide 23, so as to ease the gripping and to allow applying a numbering. As before, such semi-frames 301, 30r can thus comprise respective lateral portions 311, 31r that project with respect to the testing head 21 and in particular to the upper guide 23, as indicated in FIG. 5D.

The spacers 30 realized in the form of semi-frame 301, 30r introduce a degree of freedom and allow to separately manage a side of the testing head 21 with respect to another one, for example in terms of layers to eliminate, so as to realize a tilting of the testing head 21 with respect of the space transformer 28, if necessary because of a mismatch in the corresponding planarities. Furthermore, the use of semi-frames allows the spacers 30 to adapt themselves to testing heads 21 of different dimensions, simply by bringing the semi-frames 301-30r closer or taking them further away.

Finally, it is possible to realize the spacers 30 in the form of couples of semi-frames 301 and 30r, extended along opposed and parallel sides of the testing head 21 and in particular of the upper guide 23 and having such dimensions as to extend on the inside of its central portion 40C. Such semi-frames can be equipped with holes 35 for the passage of the retaining means 32 in the positions contemplated in the perimeter portion 40P of the upper guide 23 and of further holes 35' for the passage of further retaining means 32' in the positions contemplated in the central portion 40C of the upper guide 23, as schematically illustrated in the FIG. 5E.

As previously, the semi-frames 301, 30r that realize the spacers 30 may be sized so as to project with respect to the testing head 21 and in particular to the upper guide 23, so as to allow the gripping and to allow applying a numbering. Also in this case, the semi-frames 301-30r may comprise respective lateral portions 311, 31r that project with respect to the testing head 21 and in particular to the upper guide 23, as indicated in FIG. 5E.

It should be noted that the use of semi-frames 301, 30r that extend even within the central portion 40C of the upper guide 23 increases the number of retaining points of the semi-frames themselves, thanks to the coupling of the further holes 35' and the further retaining means 32'.

In this case, the semi-frames 301, 30r may also comprise suitable grooves 37, so as to limit the material of such semi-frames at the areas around the holes 35 and the further holes 35', as indicated in FIG. 5E. In this way, the spacers 30 being realized by such semi-frames are lighter, still guaranteeing an enhanced retaining.

It should be noted that similar grooves may be provided in the semi-frames shown in FIG. 5D as well in the whole frames, as the ones shown in FIG. 5C, also having greater dimensions, in particular in such a way to extend also within the central portion 40C of the upper guide 23, so as to also include further holes for the further retaining means 32'.

It is also possible to realize the frames or semi-frames composing the spacers 30 with such dimensions to result flat with the testing head 21 and in particular with the upper guide 23, equipping them with at least one elongated portion adapted to project from the testing head 21 and in particular from the upper guide 23 as a tab, so as to ease the gripping of the spacer 30 and allow applying a numbering. Any number of gripping tabs can be contemplated, on the base of the overall dimensions of the frames or semi-frames as well as on the base of the applications of the probe card 20, positioned so as not to hinder the normal working of the probe card 20 that comprises the spacers 30.

By using the spacers 30 equipped with holes 35, 35' for the housing of the retaining means 32, 32', of the type illustrated in FIGS. 5A-5E, it is possible to regulate the length LA of the first terminal portions 21A of the contact probes 22, unblocking such retaining means 32 and the further retaining means 32', if any, in particular by removing the respective screws, followed by a step of removing the spacers 30 or of at least one of their layers 30a-30c, with a partial disassembly of the probe card 20.

Furthermore, it should be noted that the portions of material around the holes 35 can be partially surmounted by the retaining means 32, 32' as a washer, the retaining means 32, 32' comprising for example flat-head screws, so as to realize the proper retaining of the spacers 30 thanks to the retaining means 32, 32', indeed.

The removal of the spacers 30 or of at least one of their layers 30a-30c allows to perform an approach of the space transformer 28 to the testing head 21, in particular to the upper guide 23, with a subsequent movement of the contact probes 22 toward the device to be tested 27, adapted to balance a shortening of the respective first terminal portions 21A comprising the contact tips 22A and to restore in a simple and fast way the proper working of the probe card 20. In particular, the removal of the spacers 30 or of at least one of their layers 30a-30c reduces the length LB of the floating zone 29B of the contact heads 22B and allows the contact probes 22 to further project toward the device to be tested 27.

In essence, the probe card 20 according to the disclosure allows to implement a method of adjusting the length of the first terminal portions 21A comprising the contact tips 22A of the contact probes 22 contained in a testing head 21 inserted in such a probe card, so as to restore the proper working of such testing head 21 and hence of the probe card 20 that comprises it.

Advantageously, according to the disclosure, the method comprises a step of unblocking the retaining means 32 and 32', if any, for example by means of loosening or removing respective screws, followed by a step of removing the spacers 30 or of at least their layer 30a-30c.

At this point, the method comprises a step of approaching the upper guide 23 to the space transformer 28 by reducing the LB length of the floating zone 29B of the contact heads 22B and consequently displacing the contact probes 22 toward the device to be tested 27 when the testing head 21 abuts onto the space transformer 28; in particular, in this way, the contact probes 22 project from the lower guide 24, restoring the length of the first terminal portions 21A comprising the contact tips 22A. This step of approaching the upper guide 23 to the space transformer 28 is in particular carried out so that the length of the first terminal portions 21A comprising the contact tips 22A is brought back at a value corresponding to a proper working of the testing head 21.

It should be noted that by adjusting the length of the first terminal portions 21A comprising the contact tips 22A by removing the spacers 30 or one of the layers 30a-30c comprised in them, provision should be made for restoring the retaining means 32 and of the further retaining means 32', if any, for example by screwing back the respective screws, to joined again the elements of the testing head 21 and of the probe card 20 that comprises it.

Further removals of one layer of the spacer 30 are clearly possible and the moving the space transformer 28 closer to the testing head 21, and in particular to its upper guide 23, also at a later stage of the working life of the probe card 20, in particular when the first terminal portions 21A comprising the contact tips 22A of the contact probes 22 have been further shortened, for example for the use and for cleaning operations, in particular when they have a length inferior to a length corresponding to a proper working of the testing head 21.

Moreover it is possible to perform such removals even more times, in the case of spacers 30 comprising a plurality of layers, performing in this way subsequent regulations of the length of the first terminal portions 21A comprising the contact tips 22A of the contact probes 22.

The working life of the testing head 21 and of the probe card that comprises it thus results opportunely elongated with respect to the known solutions according to which the shortening of the first terminal portions 21A comprising the contact tips 22A of the contact probes 22 causes ending the use of the testing head 21 and of the probe card that comprises it, unless realizing complicated replacements of the testing head itself.

Finally, it is possible to remove a layer of the spacer 30 and to approach the space transformer 28 to the testing head 21, and in particular to its upper guide 23, even asymmetrically, so as to differently adjust the length of the first terminal portions 21A of the contact probes 22 in case of misalignment of the respective contact tips 22A due to the tolerances of the process of making the probes themselves; it is thus possible to adjust any tilting of the planes defined by the upper guide 23 and by the space transformer 28, respectively.

In a preferred embodiment of the disclosure, the spacers 30 can be provided to include open housings 38 for the retaining means 32 as in the embodiments illustrated in FIGS. 6A-6D. Such open housings 38 allow in particular to slip the spacers 30 or one of the layers 30a-30c comprised in them off, without totally removing the retaining means 32, in particular the respective screws, a simple loosening of said retaining means being sufficient and in particular allowing the removal of the spacers 30 themselves or of one of the layers composing them by simple slipping them off and without disassembling, even partially, the testing head 21 and the probe card 20 that comprises it.

In such a case, the method according to the disclosure comprises a removal step by slipping the spacers 30 or at least of one of their layers 30a-30c off.

A further tightening of such retaining means 32 and further retaining means 32', if any, ensures the desired approach of the space transformer 28 to the testing head 21 and in particular to the upper guide 23, and thus the restoring of the appropriate length for the first terminal portions 21A comprising the contact points 22A, thus ensuring the proper working of the testing head 21 itself as well as the probe card 20 that comprises it.

More in particular, it is possible to realize the spacers 30 with shapes being similar to those illustrated before, that thus have the same advantages. For example, the spacer can have an elongated shape, as a paddle, formed by an elongated body 33 and a head 34, or a substantially rectangular tab 36 and being equipped with open housings 38, as schematically illustrated in FIGS. 6A and 6B respectively. The open housings 38 have dimensions suitable to house the retaining means 32 or further retaining means 32'.

It should be noted that the open housings 38 define in the spacers 30 at least one material portion 39, 39' which may be partially surmounted by the retaining means 32, 32', as a fork, the retaining means 32, 32' comprising for example flat head screws, so as to achieve the proper holding of the spacers 30 by means of the retaining means 32, 32' indeed.

It is immediately understood that it is anyway possible to eliminate such a spacer 30 or one of the layers 30a-30c composing it by simply loosening the retaining means 32, 32' and by moving such spacer or a layer thereof in the direction of the longitudinal development thereof and away from the testing head 21, as indicated by the arrow F in FIGS. 6A and 6B, such retaining means 32, 32' passing through an opening of the open housings 38.

In particular, the elongated shape of the paddles or tabs allows to guarantee an easy slipping of the spacers 30 or of one of the layers 30a-30c composing them off, even without having to apply high value forces.

Alternatively, the spacers 30 can be made by means of semi-frames, 30l and 30r, suitably provided with open housings 38 in correspondence of the retaining means 32 positioned for example at the perimeter portion 40P of the upper guide 23 and of further open housings 38', if any, in correspondence of the other retaining means 32' positioned for example in correspondence of the central portion 40C of the upper guide 23 as schematically shown in FIG. 6C and FIG. 6D, respectively.

Suitably, such semi-frames 30r and 30l that realize the spacers 30 can be sized so as to project with respect to the testing head 21 and in particular to the upper guide 23, so as to be easily graspable and to allow applying a numbering, in particular on each of the layers that compose it, as previously explained. In this case, the semi-frames 30l, 30r may comprise respective lateral portions 31l, 31r that project with respect to the testing head 21 and in particular to the upper guide 23, as indicated in FIGS. 6C and 6D.

It is immediately understood that it is also possible in this case to eliminate a spacer 30 or one of the layers 30a-30c composing it by simply loosening the retaining means 32, 32' and moving the semi-frames 30l and 30r or one of their layers moving away from the testing head 21, as shown by the arrows F1 and F2 in FIGS. 6C and 6D, the retaining means 32 and 32' may also in this case pass from the openings of the open housings 38, 38'.

Since the spacers 30 made by semi-frames are structurally stronger than the paddles or the tabs, by virtue of their greater area, however smaller than that of the upper guide 23, it is possible in this case to apply forces of higher value than those used for example in the case of the spacers 30 made by means of paddles or tabs.

As before, it is possible to realize the semi-frames composing the spacers 30 with such dimensions that they result as flushed with the testing head 21, in particular with the upper guide 23, then providing them with at least one elongated portion adapted to project from the testing head 21 and in particular from the upper guide 23 as a tab to facilitate the gripping of the spacer 30 and to allow applying a numbering.

Using spacers 30 provided with open housings 38, 38' for the housing of the retaining means 32, 32' of the type illustrated in FIGS. 6A-6D, it is possible to adjust the length LA of the first terminal portions 21A of the contact probes 22 simply by loosening the retaining means 32 and further retaining means 32', if any, in particular by partially descrewing the respective screws, followed by slipping the spacers 30 or at least one of their layers 30a-30c off, while maintaining the structural integrity of the testing head 21.

In the case of spacers 30 made by semi-frames, structurally more solid and able to withstand greater forces than the paddles or the tabs, it is possible to contemplate a slipping of the spacers 30 also even without a prior clear loosening of the retaining means 32, 32'.

As already explained, the removal of the spacers 30 or of at least one of their layers 30a-30c allows to perform an approach of the space transformer 28 to the testing head 21 and in particular to the upper guide 23, with subsequent reduction of the floating zone 29B and of the second terminal portion 21B comprising the contact heads 22B of the contact probes 22 and thus to allow a movement of the contact probes 22 towards the device to be tested 27, so as to compensate a shortening of the respective first terminal portions 21A comprising the contact tips 22A of the contact probes 22 and to restore in a simple and fast way the proper working of the testing head 21 and of the probe card 20 that comprises it.

It will then be necessary to tighten the retaining means 32 and the further retaining means 32', if any, in particular by screwing back the respective screws, to fully re-joined the elements of the testing head 21 and of the probe card 20. In any case, it should be emphasized that the use of the open housings 38 allows avoiding an even partial disassembly of the testing head 21 to remove the spacers 30 or one of their layers.

It is of course possible to further remove a layer of spacers 30, also at a later stage in the working life of the probe card 20, as well as to perform such removal several times, in the case of spacers 30 having a plurality of layers, with consequent successive adjustments of the length LA of the first terminal portions 21A of the contact probes 22 and finally removing a spacer layer 30, also in an asymmetrical manner.

Finally, according to a further embodiment of the disclosure, particularly in the case of columnar spacers 30 of the type illustrated for example in FIGS. 3C and 3D, it is possible to realize the spacers 30 by means of one or more layers 30a-30c of any shape, in case joined together with one another and with the upper guide 23 by means of respective adhesive films.

In particular, such spacers 30 have a shape suitable for positioning on the upper guide 23, both in its perimeter portion 40P and in its central portion 40C, so as not to interfere with the proper working of the contact probes 22. Such columnar spacers 30 are made without any hole or any housing of the retaining means 32, 32' and are arranged on the upper guide 23 so as not to be crossed by such holding means 32, 32'.

It should be noted that in this case the removal of the columnar spacers 30 or of one of their layers is made by means of simple peeling, without requiring the removal of any retaining means of the testing head 21. As already indicated, no projecting portions of the columnar spacers 30 with respect to the upper guide 23 and thus to the testing head 21 are needed.

The adjustment mechanism of the length of the first terminal portions 21A comprising the contact tips 22A of the contact probes 22 is thus further simplified, requiring only the removal of the testing head 21 from the probe card 20 and therefore from its association with the space transformer 28 in order to expose the upper guide 23 and thus to allow the removal by peeling the columnar spacers 30 or one of their layers.

It should be noted that all the illustrated embodiments of the probe card according to the present disclosure allow for an adjustment of the length of the terminal portion of the contact probes comprising the contact tips and therefore subjected to consumption without modifying the length of the bending zone of the probes and therefore the movement dynamics of the same, in particular in terms of scrub and especially of force exerted on the pads.

In conclusion, the probe card with spacer according to the disclosure turns out having a longer working life, since it is possible to contemplate a large number of cleaning operations of the respective tip with a subsequent adjustment of the length of the terminal portions of the contact probes projecting with respect to the lower guide so that it is equal to or greater than the length corresponding to the proper working of the testing head.

The presence of the spacer allows to restore in an easy and quick way the proper working of the probe card after a period of operation that has led to a shortening of the terminal portions of the contact probes of the testing head comprised therein, without affecting the movement dynamic of such probes and, above all, the force exerted by them, since the length of the bending zone of the probes is kept constant.

Opportunely, the spacers are realized so as to extend over limited areas, even significantly limited as in the case of columnar, paddle or tab shaped embodiments, with respect to the area of the guides of the testing head; such spacers can be positioned at will, both in number and position, and exhibit less flatness problems than the other elements composing the probe card and being formed by whole boards, such as the guides of the testing head or the space transformer, indeed.

In addition, it is possible to perform further adjustments of the length of the terminal portions of the contact probes at different stages of the working life of the probe card, particularly whenever such terminal portions, i.e. the first terminal portions comprising the contact tips of the contact probes, are shortened for use and have a shorter length than a length corresponding to a proper working of the testing head comprised in such probe card, also allowing to change the length of the terminal portions in a different way for different contact probes in case of misalignment of the respective contact tips due to the tolerances of the manufacturing process of the probes themselves.

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A probe card for a testing equipment of electronic devices comprises:
   at least one space transformer provided with a plurality of contact pads;
   at least one testing head in turn including:
      a plurality of contact probes
      at least one upper guide provided with guide holes for housing the plurality of contact probes; and
      at least one lower guide provided with guide holes for housing the plurality of contact probes
      a bending zone of the contact probes being defined between the upper and lower guides, each contact probe having:
         at least one first terminal portion projecting from the lower guide with a first length and ending with a contact tip adapted to abut onto a respective contact pad of a device to be tested; and
         at least one second terminal portion projecting from the upper guide with a second length and ending with a contact head adapted to abut onto one contact pad of the space transformer; and
   at least one spacer element interposed between the space transformer and the upper guide of the testing head,
   the spacer element comprising a plurality of layers that are overlapping, joined to one another and individually removable to adjust the first length of the first terminal portion of the contact probes by changing the second length of the second terminal portion of the contact probes so approaching the upper guide of the testing head to the space transformer; and
   the layers of the spacer element having respective projecting portions from the upper guide of the testing head with gradually increasing or decreasing lengths from one another.

2. The probe card of claim 1, wherein the spacer element is joined to said upper guide.

3. The probe card of claim 1, wherein the layers have a numbering put onto a face of the projecting portions.

4. The probe card of claim 1, wherein the spacer element has a height equal to a sum of thicknesses of the layers and corresponding to the second length of the second terminal portion of the contact probes.

5. The probe card of claim 1, wherein the spacer element is made of a plastic material, transparent or semitransparent, or a ceramic material or a metallic material, or an organic material, or silicon.

6. A method of restoring a probe card comprising at least one testing head in turn including at least one upper guide and one lower guide and a plurality of contact probes inserted into guide holes of the upper and lower guides, as well as at least one space transformer with a plurality of contact pads, each of the contact probes having at least one first terminal portion projecting from the lower guide with a first length and ending with a contact tip adapted to abut onto a respective contact pad of a device to be tested, as well as one second terminal portion projecting from the upper guide with a second length and ending with a contact head adapted to abut onto one of the contact pads of the space transformer, the probe card further comprising at least one spacer element interposed between the space transformer and the upper guide of the testing head, comprising a plurality of layers overlapping, joined to one another and individually removable, the layers having respective projecting portions from the upper guide of the testing head with gradually increasing or decreasing lengths from one another, the method comprising:
   de-joining the space transformer from the upper guide of the testing head;
   removing one of the layers composing the spacer element;
   approaching the upper guide and the space transformer; and
   joining again the testing head and the space transformer, the first length of the first terminal portion of the contact probes being adjusted by changing the second length of the second terminal portion of the contact probes so approaching the upper guide of the testing head to the space transformer and restoring a proper working of the testing head and therefore of the probe card including the testing head.

* * * * *